United States Patent [19]
Meisser et al.

[11] Patent Number: 5,114,302
[45] Date of Patent: May 19, 1992

[54] APPARATUS FOR PERFORMING IN-FEED OF WORKING MEMBER TO WORKING STATION

[75] Inventors: Claudio Meisser, Cham; Hans Eggenschwiler; Walter Nehls, both of Steinhausen, all of Switzerland

[73] Assignee: Esec SA, Cham, Switzerland

[21] Appl. No.: 274,865

[22] Filed: Nov. 22, 1988

[30] Foreign Application Priority Data

Nov. 25, 1987 [CH] Switzerland .......... 4579/87

[51] Int. Cl.⁵ .................................. B25T 5/00
[52] U.S. Cl. .................... 414/751; 29/740; 29/759; 269/73; 901/16
[58] Field of Search ........... 414/749, 751, 753; 901/16; 180/125, 168; 74/479; 269/73, 269, 20; 310/14; 29/740, 743, 759

[56] References Cited

U.S. PATENT DOCUMENTS

| | | | |
|---|---|---|---|
| 4,229,136 | 10/1980 | Panissidi | 414/753 X |
| 4,654,571 | 3/1987 | Hinds | 318/687 |
| 4,716,530 | 12/1987 | Ogawa et al. | 180/168 X |
| 4,753,311 | 6/1988 | Berger et al. | 180/125 |
| 4,834,353 | 5/1989 | Chitayat | 269/73 |

FOREIGN PATENT DOCUMENTS 2032170 11/1970 France .

Primary Examiner—David A. Bucci
Assistant Examiner—Donald W. Underwood
Attorney, Agent, or Firm—Egli International

[57] ABSTRACT

An apparatus for performing an exact in-feed in the X and/or Y direction in the plane of a bond head, e.g. a gripper, to a working station containing a sliding plate, a support element, a first and second drives for performing the in-feeds, a guide mechanism provided with a slide part and a guide part and an integrated measuring device for determining movements of the support element oriented in the X and/or Y direction. The support element is mounted in the horizontal plane with translational and rotational degrees of freedom by a vacuum-pressurizable air bearing on the sliding plate and vertically by a vacuum-pressurizable air bearing on the slide part, the latter additionally being mounted with a vacuum-pressurizable air bearing on the sliding plate and with a counterpressure air bearing between two webs of the guide part.

19 Claims, 5 Drawing Sheets

APPARATUS FOR PERFORMING IN-FEED OF WORKING MEMBER TO WORKING STATION

BACKGROUND OF THE INVENTION

The present invention relates to an apparatus for performing the in-feed of a working member, particularly a bond head, to a working station. An apparatus of the foregoing type includes a support element constructed for receiving the bond head and positioned on a sliding plate or the like and which is operatively connected to at least two drives, e.g. electromotive drives, and is adjustable relative to the sliding plate along two axes of coordinates, in the X and/or Y direction oriented roughly at right angles to one another in the plane.

German Patent 22 44 442 discloses an adjusting mechanism essentially operable with electrical means and which comprises a stator member and a rotor member. The face of the stator member facing the rotor member is subdivided into zones, each of which has parallel magnetizable material ribs. On the underside of the rotor member, are arranged electromagnetic means cooperating with said zones in such a way that on exciting or energizing of the electromagnetic means there can be a movement of the rotor member in the X or Y direction. It is also possible to provide an air gap between the rotor member and the stator member, so that the rotor member constructed as a head floats essentially on an air cushion over the stator member constructed as a plate.

SUMMARY OF THE INVENTION

It is an object of the present invention to provide an improved apparatus which would make it possible to achieve with single means a highly dynamic and exact in-feed of the support element provided with the bond head to the working station and which is secured against forces acting vertically on the support element whilst using simple means.

According to the invention this and other objects are attained by an apparatus in which the support element is operatively connected with the moving part of the electromotive drive and by means of a sliding bearing associated with the sliding plate is movable in a predetermined, horizontal plane with rotational and translational degrees of freedom and is arranged in substantially freely floating manner o the sliding plate.

The aforementioned objects, features and advantages of the invention will, in part, be pointed out with particularity, and will, in part, become obvious from the following more detailed description of the invention, taken in conjunction with the accompanying drawing, which form an integral part thereof.

DETAILED DESCRIPTION OF THE PREFERRED EMBODIMENTS

Figure 1:
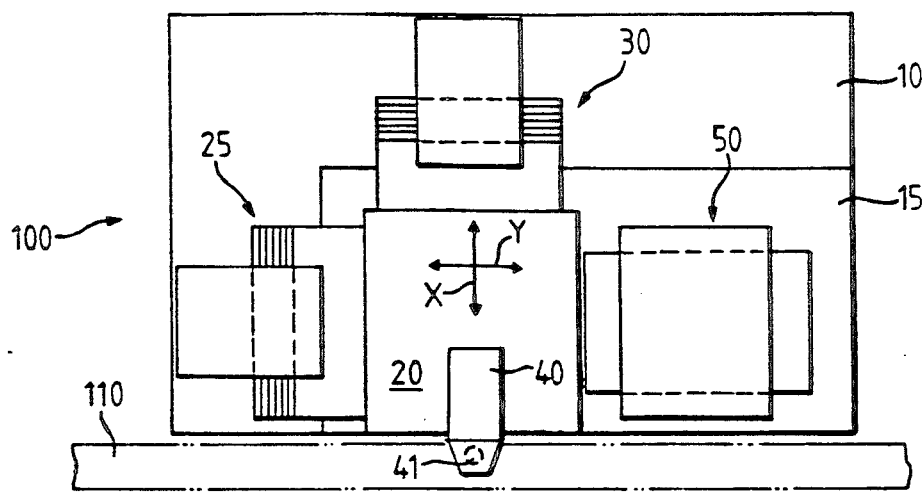
FIG. 1 is a schematic view of an embodiment of an apparatus for performing an in-feed of a working member to a working station.
Figure 2:
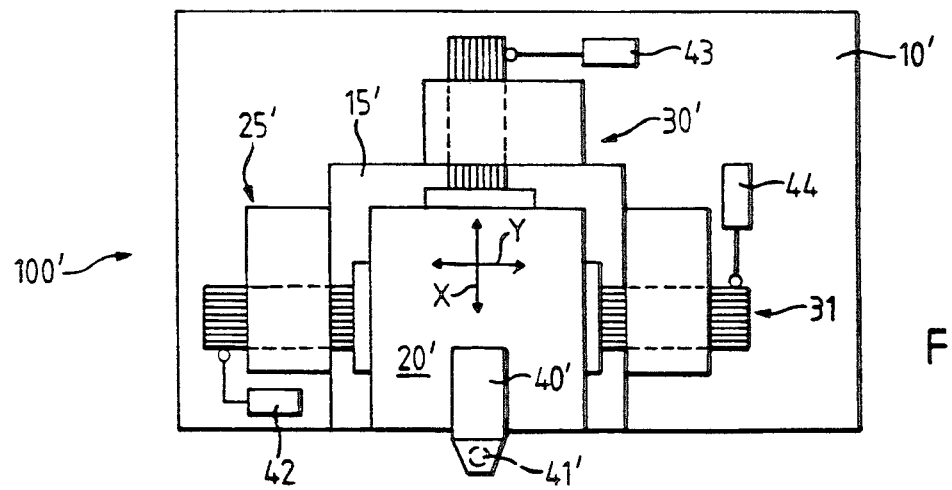
FIG. 2 is a schematic view of a second embodiment of the apparatus for performing the in-feed of the working member.
Figure 3:
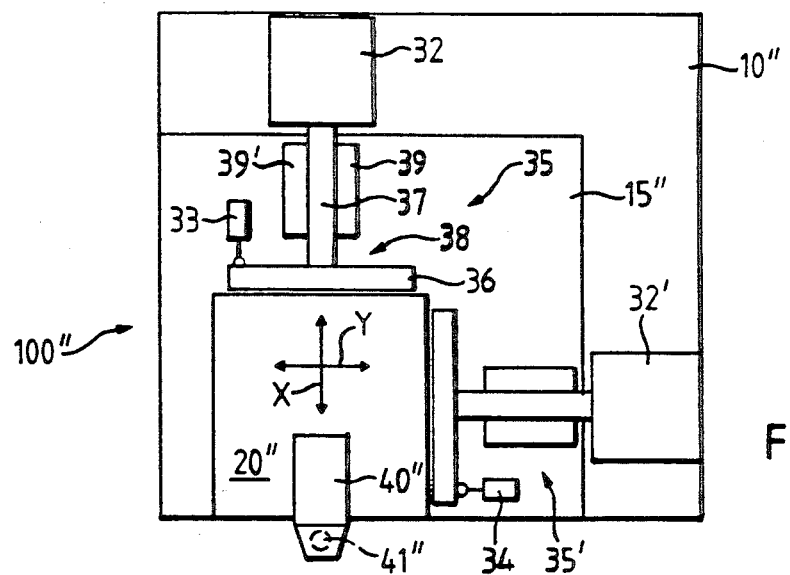
FIG. 3 is a schematic view of a third embodiment of the apparatus for performing the in-feed of the working member.

Each of the FIGS. 1, 2 and 3, for the purpose of illustrating the invention and as a general system survey, diagrammatically shows an apparatus designated overall by 100, 100' or 100" and which is constructed for performing an in-feed of a working member (not shown in FIGS. 1 to 3 but shown in FIG. 4) to a working station. The in-feed of the working member to a correspondingly associated conveyor belt 110 (only shown in FIG. 1) or the like takes place roughly along two axes of coordinates in the X and/or Y direction oriented approximately at right angles to one another in the plane.

The apparatus 100 according to FIG. 1 substantially comprises a base plate 10, a sliding plate 15, a support element 20 for the working member (not shown in this FIG.), a first drive 25 for an in-feed of the support element 20 in the Y direction and a second drive 30 for an in-feed of support element 20 oriented in the X direction, as well as a guide mechanism 50 operatively connected to the support element 20. The support element 20 is constructed for receiving the working member (part 45 in FIG. 4) and an arm or jib 40. On the side facing the conveyor belt 110, an optical scanning member 41 (sensor) is provided on the arm 40.

Apparatus 100, according to FIG. 2 substantially comprises a base plate 10', a sliding plate 15', a support element 20' with arm 40, and scanning member 41', a first drive 25' for the in-feed oriented in the X direction and a second drive 30' for the in-feed in the Y direction. Unlike in the case of the apparatus 100 according to FIG. 1, with the apparatus 100' in place of the guide mechanism 50 there is a further, third drive 31 corresponding to the first drive 25'. It is also possible to see in FIG. 2 measuring members 42, 43, 44 associated with drives 25', 30, and 31, respectively. The measuring members are constructed and arranged for a spacing measurement and for a parallelism measurement.

Apparatus 100" according to FIG. 3 substantially comprises a base plate 10", a sliding plate 15", a support element 20" with arm 40" and scanning member 41". Unlike in the case of FIGS. 1 and 2, with the embodiment of FIG. 3 there are two diagrammatically shown, known per se direct current linear motors 32, 32', which are in each case operatively connected to the corresponding support element by means of a correspondingly constructed guide mechanism 35, 35' for the actual in-feed of support element 20". The individual guide mechanism 35 or 35' has a T-shaped slide part 38 formed from a flange 36 and a web 37 and arranged with the latter between two guide parts 39, 39'. On the side facing the support element 20", flange 36 for operative connection to the latter is provided with a vacuum-pressurizable air bearing 3 (FIG. 8), whilst the web 37 is arranged and mounted by means of a so-called counterpressure bearing 4 (FIG. 6) between the two guides 39, 39'. Corresponding measuring members 33, 34 are associated with the two guide mechanisms 35, 35'.

In the case of the aforementioned embodiments of apparatuses 100, 100' and 100" according to FIGS. 1, 2 and 3 the particular support element 20, 20' and 20" is mounted by means of a vacuum-pressurizable air cushion bearing 1, hereinafter called a air bearing 1, and secured against vertical forces on the sliding plate 15, 15' and 15" so as to be freely movable in the X and/or Y direction in the plane. In the FIG. 5b embodiment, whilst retaining the same operating conditions, the air bearing 1 can be constructed as a so-called magnetizable floating bearing.

Figure 4:
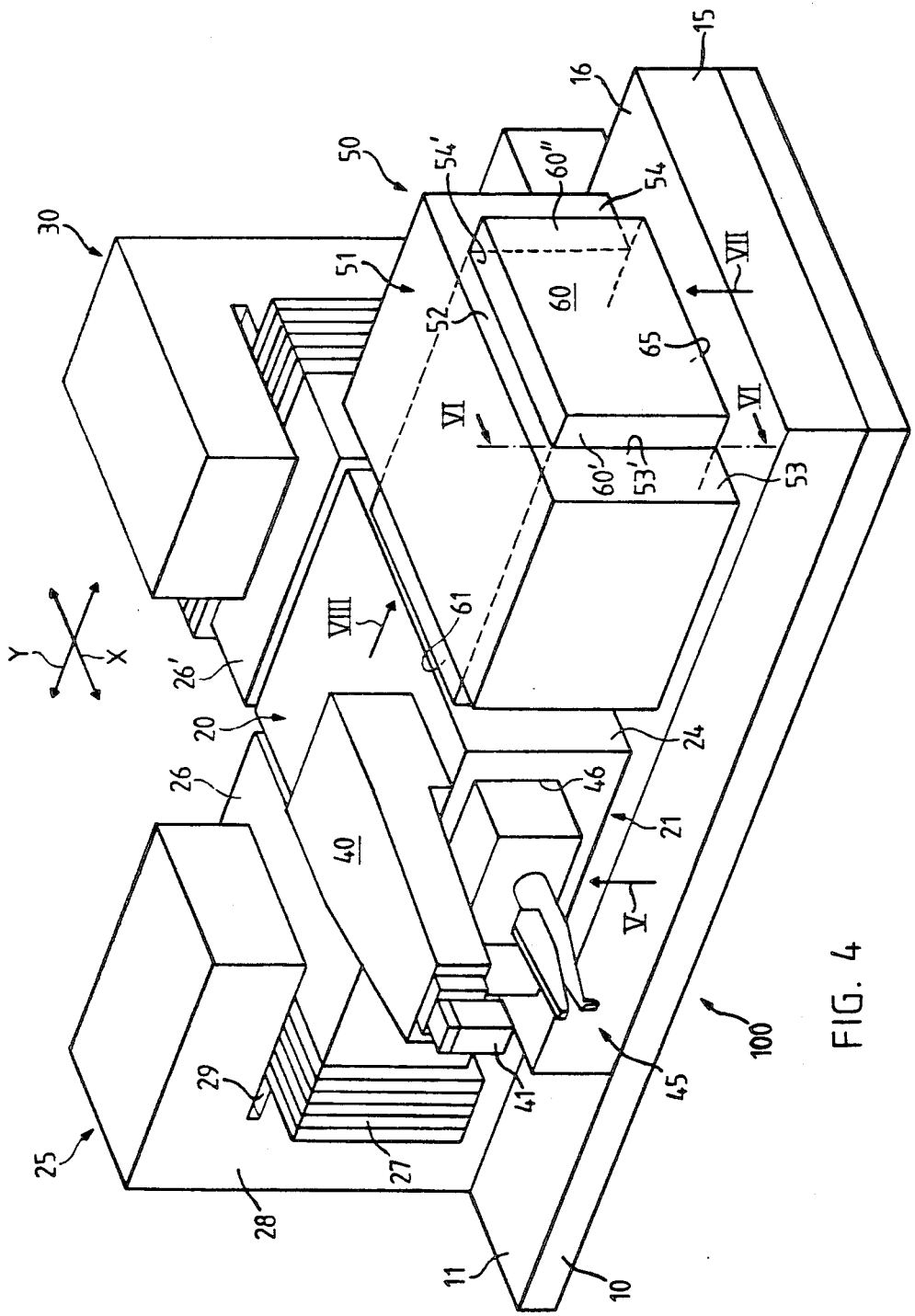
FIG. 4 is a perspective view of the apparatus according to FIG. 1 shown on a larger scale.

FIG. 4 shows as a preferred embodiment the apparatus 100, shown on a larger scale and in perspective view, and it is possible to see the base plate 10, sliding plate 15, support element 20 with arm 40, the two drives 25 and 30, as well as a guide mechanism 50. The base plate 10 has an absolutely flat assembly surface 11, which is provided and correspondingly constructed as a bearing and fixing surface for the two drives 25, 30, as well as for the sliding plate 15.

Sliding plate 15 is fixed by non-shown but any suitable conventional means to base plate 10 and is provided on the side facing support element 20 and guide mechanism 50 with a planar sliding surface 16. For forming a so-called air cushion bearing, the sliding surface 16 has a correspondingly constructed and preferably ground surface structure. Base plate 10 and sliding plate 15 can also be constructed in one piece as a standard component, whilst retaining corresponding bearing, fixing and sliding surfaces.

The support element 20 is preferably constructed as a box-like hollow body with a recess 46 for receiving and fixing the working member, e.g. gripper member 45 constructed in accordance with semiconductor technology. The vacuum-pressurizable air cushion bearing 1 is arranged on the underside 21 of support element 20 for compensating for forces acting vertically o element 20.

Figure 5A:
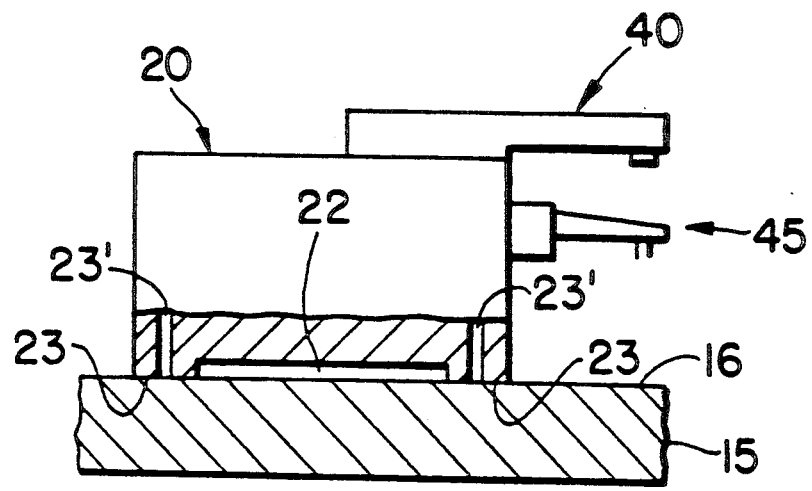
FIG. 5a schematically shows a support element supported on a compressed air zone formed between the sliding plate and the support element.
Figure 5B:
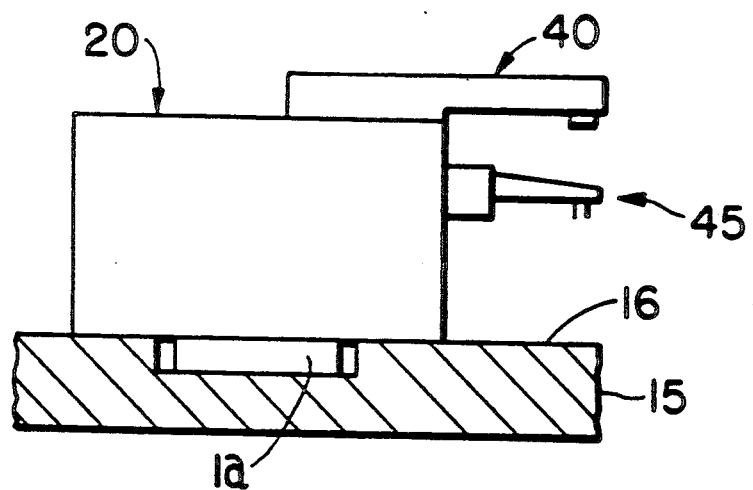
FIG. 5b shows a support element of the apparatus of FIG. 4 arranged on the sliding plate by a magnetizable floating bearing.
Figure 5:
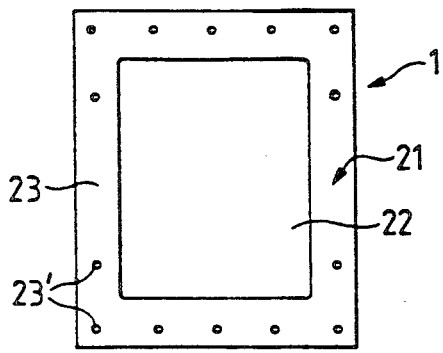
FIG. 5 schematically shows the underside of a support element for the working member as seen in the direction of arrow V in FIG. 4.

FIG. 5 shows in accordance with arrow direction V in FIG. 4, the air cushion bearing 1 arranged on the underside 21 of support element 20, and it is possible to see a vacuum zone 22 constructed as a depression or recess which is completely circumferentially surrounded by a compressed air zone 23 provided with spaced bores 23, or the like.

FIG. 5a shows a side view of the support element 20 supported on the air cushion bearing, formed by the compressed air zone 23 which surrounds the vacuum zone 22.

FIG. 5b shows support element 20 arranged on the sliding plate 15 by means of a magnetizable floating bearing provided by a magnet spool 1a attached to the underside of the support element 20.

Referring back to FIG. 4, the guide mechanism 50 comprises a guide part 51 and a slide part 60. The guide part 51 which is U-shaped in cross-section has two approximately parallel webs 53, 54 interconnected by a flange 52. Guide part 51 is arranged with the two webs 53, 54 on the sliding surface 16 of sliding plate 15 and is detachably fixed thereto by non-shown conventional fastening means. The two inside faces 53, and 54, of webs 53, 54 facing the slide part 60 are constructed as counterpressure bearings 4.

Figure 6:
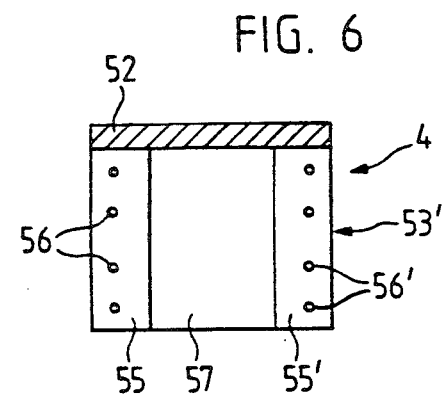
FIG. 6 is a sectional view along line VI—VI of FIG. 4 showing a guide mechanism for the apparatus according to FIG. 1.

FIG. 6 shows a sectional view along line VI—VI of FIG. 4 as an embodiment the guide part 51 with the counterpressure bearing 4 arranged on the inside face 53' and it is possible to see two compressed air zones 55, 55' separated and spaced from one another by a depression or recess 57 and provided with spaced apart bores 56, 56'.

The substantially parallelepipedic slide part 60 is, on the one hand, provided on the end 61 facing side wall 24 of support element 20 with an air bearing 3 and, on the other hand, on the underside 65 facing sliding surface 16 of sliding plate 15 with an air bearing 2.

Figure 7:
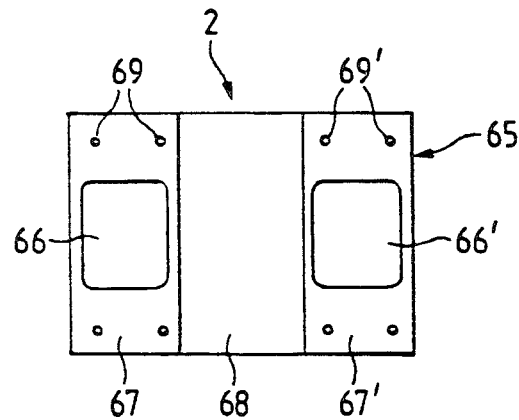
FIG. 7 is a schematic view from below of a guide part for the apparatus according to FIG. 1 shown in the direction of arrow VII in FIG. 4.

FIG. 7 shows in the direction of arrow VII of FIG. 4 the air bearing 2 arranged on the underside 65 of slide part 60, and it is possible to see two compressed air zones 67, 67' spaced from one another by a recess or depression 68 and in each of which is arranged a vacuum zone 66, 66' constructed as a recess or depression. Correspondingly spaced-apart bores 69, 69' are provided in the individual compressed air zones 67, 67'.

Figure 8:
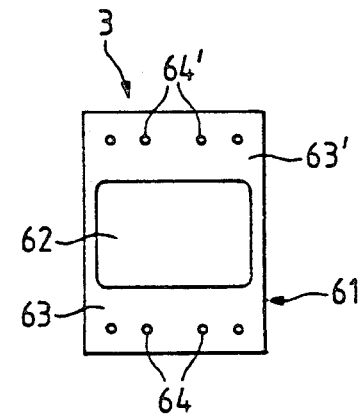
FIG. 8 is a schematic front view of the guide part for the apparatus according to FIG. 1 shown in the direction of arrow VIII in FIG. 4.

FIG. 8 shows in the direction of arrow VIII of FIG. 4 the air bearing 3 arranged on end 61 of slide part 60, and it is possible to see a vacuum zone 62 constructed as a recess or depression and compressed air zones 63, 63' surrounding the vacuum zone 62 and provided with spaced-apart bores 64, 64'.

It is pointed out at this point that the air bearing 1 (FIG. 5) arranged on the underside 21 of support element 20 and the air bearing 2 (FIG. 7) arranged on the underside 65 of slide part 60, as well as the air bearing 3 (FIG. 8) arranged on the end 61 of slide part 60 are in each case constructed in the form of vacuum-pressurizable air bearings, whilst the air bearing 4 (FIG. 6) associated with the two lateral faces 60', 60" of slide part 60 and positioned on the inside faces 53', 54' of webs 53, 54 is preferably constructed as a so-called counterpressure bearing. The individual air bearings 1, 2, 3 and 4 are operatively connected to a corresponding energy source for producing the vacuum or for the compressed air supply, via a non-shown channel or duct system arranged in the individual elements in a known fashion.

The two electromotively constructed drives 25 and 30 according to FIG. 4 are identical as regards construction and operation. At this point only the essential elements of one drive 25 are described.

As can be seen from FIG. 4, drive 25 comprises a stator body 28 provided with not shown magnets, a bobbin or coil former 27 arranged in correspondingly constructed slots 29 (only one slot is shown) of stator body 28 and supported on a support member 26. Stator body 28 has at least two parallel, spaced slots 29 and is arranged, preferably detachably fixed by non-shown suitable means to the surface 11 of base plate 10.

Support member 26 is constructed for receiving the bobbin 27 and is detachably fixed by non-shown means to the support element 20. For receiving a bobbin for drive 30 a further support member 26' is provided on support element 20. The individual, not designated elements of drive 30 are identical to elements 27, 28 and 29 of drive 25.

The individual parts of the electromotive drives 25 and 30 according to FIGS. 1 and 4, as well as parts 25', 30' and 31 according to FIG. 2 are constructed and reciprocally-pivotally arranged so that in the case of corresponding direct current or direct current pulse excitation of bobbin 27 of a respective drive, a horizontal lifting movement of the operatively interconnected parts 27, 26 and 20 relative to stator body 28 is produced in the X and/or Y direction. As a result of the special construction and arrangement of parts 26 and 27 in slots 29 of stator body 28, apart from the substantially linear movement in the X or Y direction, it is also possible to produce a movement roughly at right angles thereto, i.e. oriented roughly parallel to the path of the turns of bobbin 27. This transverse movement is dependent on the internal dimensions of the e.g. box frame-like parts 26, 27 with respect to the external size of the central flange of the stator body 28 surrounded in complete circumferential manner by parts 26, 27.

In the embodiment of the electromotive drive 25 shown in FIG. 4 the support member 26 for bobbin 27 is rigidly connected to support element 20 and forms a floating standard component substantially freely movable in the horizontal plane relative to the fixed stator body 28. The support member 26 is arranged and fixed by non-shown but any suitable conventional means to support element 20 so that the magnetic flux acting on element 20 substantially passes through the center of gravity of element 20. Support element 20 together with the bobbin 27 and support member 26, with respect to the fixed stator body 28, can be moved in a first direction, which is roughly in the same direction as that of the axis of the bobbin, as well as in a second direction roughly at right angles to that axis. The electromotive drive 30 is constructed identically to drive 25.

In a not shown variant of the electromagnetic drives, it is also possible to construct the stator body 28 and the support element 20 or 20' as a standard component and to arrange the support member 26 with bobbin 27 in a fixed manner. Support element 20, 20' together with the stator body is movable relative to a fixed support member for the bobbin in a first direction roughly in the same direction as the bobbin axis and in a second direction roughly at right angles thereto.

It is pointed out at this point that drives 25, 25'; 30, 30' and 31 shown in FIGS. 1, 2 and 4 do not form part of the present invention with regards to their specific construction and operation and are consequently not described in detail here.

Figure 9:
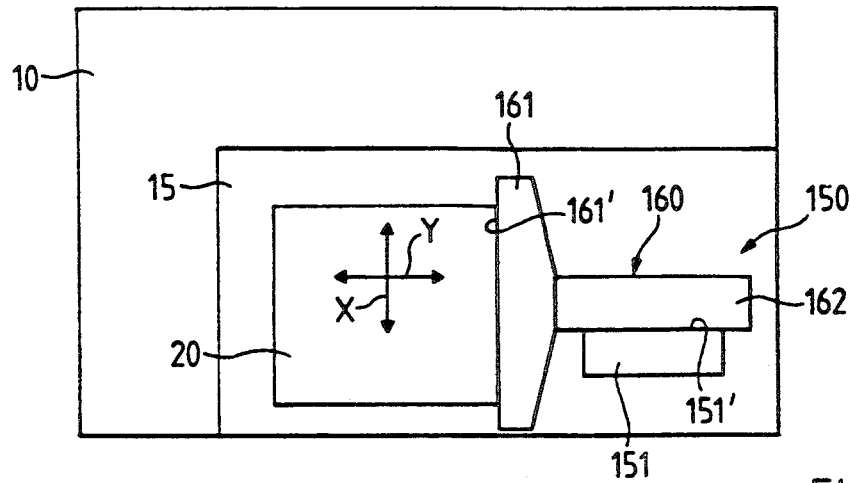
FIG. 9 is a schematic view of a first embodiment of the guide mechanism for the apparatus according to FIGS. 1 or 3.

FIG. 9 shows diagrammatically an embodiment of a guide mechanism 150 for apparatus 100 shown in FIG. 1. There are shown the base plate 10 with the sliding plate 15 arranged thereon, as well as the support element 20 adjustable on the sliding plate in the X and/or Y direction and operatively connected to the drives not shown here. Support element 20 is freely adjustably arranged on the sliding plate 15 by means of the vacuum-pressurizable air bearing 1 shown in FIG. 5. Guide mechanism 150 comprises a slide part 160 which is T-shaped in cross-section and has a flange 161 and a web 162 roughly at right angles thereto. Flange 16 with web 162 is guided on a beam-like guide part 151, which is detachably fixed by not shown means to the surface of sliding plate 15. The vertically oriented flange surface 161' facing the support element 20, as well as the vertically oriented guide surface 151' facing web 162 are in each case provided with a vacuum-pressurizable air bearing 3, such as is e.g. shown in FIG. 8.

Figure 10:
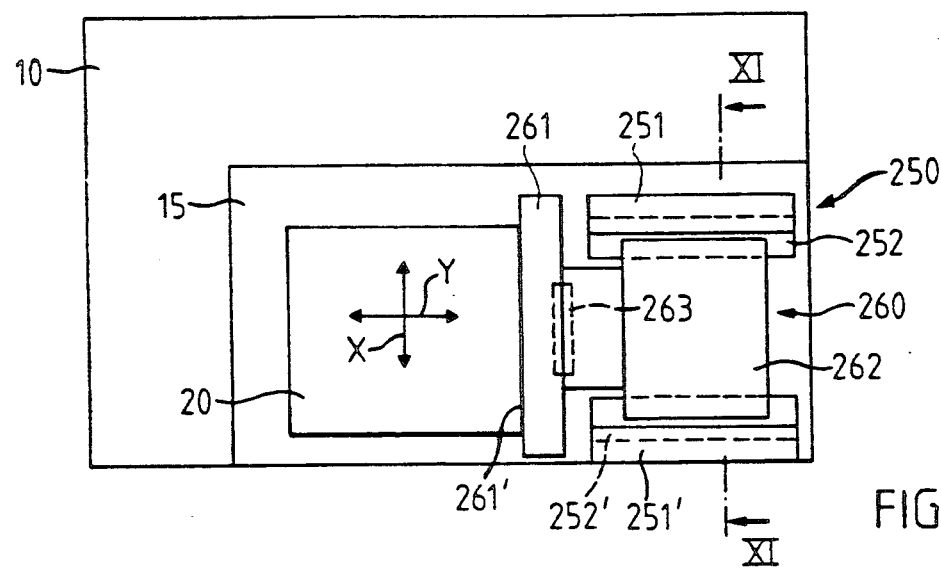
FIG. 10 is a schematic view of a second embodiment of the guide mechanism for the apparatus according to FIGS. 1 or 3.
Figure 11:
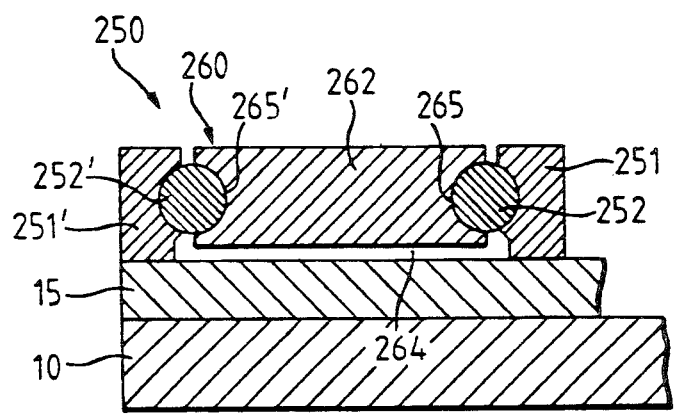
FIG. 11 is a section taken along line XI—XI through the guide mechanism of FIG. 10.

FIG. 10 shows another embodiment of guide mechanism 250 for the support element 20 of apparatus 100 according to FIG. 1, and it is possible to see base plate 10, sliding plate 15 and the support element 20 for the not shown bond head adjustable in vacuum-pressurized manner on sliding plate 15 against vertical forces by means of the air bearing shown in FIG. 5. Guide mechanism 250 comprises a substantially two-part slide part 260 essentially comprising a beam-like flange 261 and a plate-like web 262. Web 262 is operatively connected to flange 261 by means of a resiliently acting sheet metal strip 263 integrated into parts 261 and 262. As shown in FIG. 11 in section according to line XI—XI of FIG. 10, slide part 260 is held in two guide parts 251, 251' arranged laterally on sliding plate 15 and spaced from sliding plate 15 by a small gap 264. The vertical flange surface 261' facing the support element 20 is provided with vacuum-pressurizable air bearing 3, like that shown e.g. in FIG. 8. Between two guide parts 251, 251' and web 262, is provided a profile body constituting a connecting element, which in exemplified embodiment is a cylindrical profile body 252, 252, The parts 251, 251' and web 262 are provided with recesses corresponding to the profile body. In each case an air bearing 265, 265' is generated between the outer surface of each of the individual profile bodies 252, 252' and the recess in web 262 of slide part 260.

For determining the instantaneous position of support element 20, 20' or 20" and for the corresponding control or operation of the associated electromotive drives 25, 30 or 25', 30' 31 or 32, 32' on the apparatus 100, a00' or 100", are provided correspondingly constructed measuring members by means of which, as a function of a result, e.g. a comparison result, the particular drive operating in the X or Y direction is operated, e.g. by a direct current exciting pulse.

Figure 12:
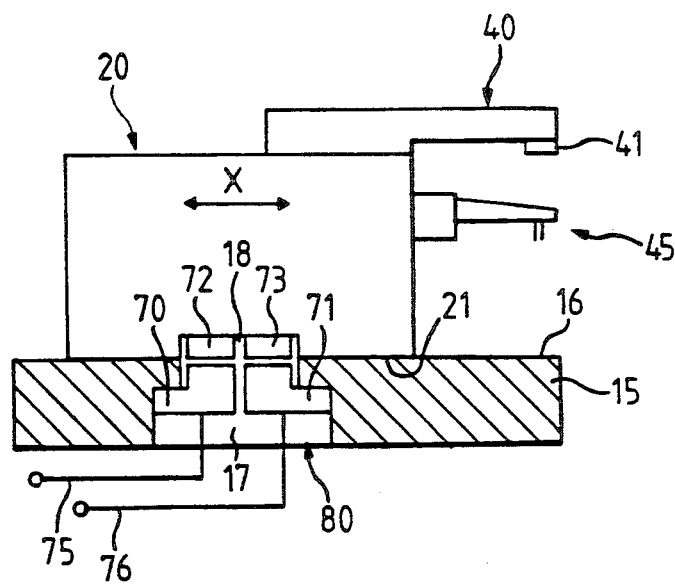
FIG. 12 diagrammatically shows measuring means for the apparatus according to FIGS. 1 and 4.

In the preferred embodiment of the apparatus 100 according to FIGS. 1 or 4, as diagrammatically shown in FIG. 12, in the support element 20 there are two measuring elements 72, 73 in a corresponding recess 18 formed on the underside 21 facing sliding plate 15. The measuring elements 72, 73 are detachably fixed to element 20 by not shown means. In a recess 17 of sliding plate 15, two measuring heads 70, 71 associated with the measuring elements 72, 73, respectively are fixed by not shown means. Together, the individual elements 70 to 75 form an optronic measuring means 80. The measuring elements 72, 73 can e.g. be so-called glass scales, whereof one is provided with bar or line units in the X direction and the other with such units oriented in the Y direction. The measuring element can also be a plate or the like constructed in one piece and provided with bar units oriented in the X and Y direction and fitted into a recess 18 or arranged on a suitable point of support element 20. By means of the preferably optronically operated measuring heads 70, 71, position-dependent data are determined by the measuring elements 72, 73 arranged on support element 20. These data are converted into signals, which are supplied via lines 74, 75, e.g. to the electromotive drives 25, 30, or to a non-shown but known control mechanism which operates the drives 25, 30.

There has been disclosed heretofore the best embodiment of the invention presently contemplated. However, it is to be understood that various changes and modifications may be made thereto without departing from the spirit of the invention.

What is claimed is:

1. Apparatus for performing the in-feed of a working member to a working station, comprising a sliding plate; a support element for receiving the working member and arranged on the sliding plate; at least two drives operatively connected to said support element to adjust the support element in X and Y direction along two axes of coordinates oriented substantially at right angles to one another in a plane, with respect to the sliding plate, said support element being operatively connected with a moving part of a respective drive, said support element being arranged on the sliding plate in vacuum-pressurized manner by at least one air cushion bearing arranged on an underside of the support element, said underside facing said sliding plate and being formed with a substantially flat vacuum zone and a compressed air zone completely surrounding said vacuum zone so that said support element is movable by said drives over said bearing in a single given horizontal plane with a translational degree of freedom and is supported in substantially freely floating manner on said sliding plate.

2. Apparatus according to claim 1, wherein said drives are electromotive drives.

3. Apparatus for performing the in-feed of a working member to a working station, comprising a sliding plate; a support element for receiving the working member and arranged on the sliding plate; at least two drives operatively connected to said support element to adjust the support element in X and Y direction along two axes of coordinates oriented substantially at right angles to one another in a plane, with respect to the sliding plate, said support element being operatively connected with a moving part of a respective drive and being movable by said drives over a sliding bearing associated with the sliding plate in a single given horizontal plane with a translational degree of freedom, said support element being arranged on said sliding plate by at least one magnetizable floating bearing provided on an underside of said support element, facing the sliding plate.

4. Apparatus according to claim 1, wherein said drives include a first drive and a second drive and said support element is operatively connected to said first drive for the movement oriented in the Y direction and with said second drive for the movement oriented in the X direction; and further including on a side opposite the first drive a guide mechanism, and optronic measuring means correspondingly associated with said support element, the optronic measuring means being constructed for determining the movement of the support element in the X and Y direction relative to the sliding plate and for operating a control means for said two drives.

5. Apparatus according to claim 1, wherein two corresponding drives are operatively connected to said support element for the movement in the Y direction and wherein for determining the movement in the X and Y direction and for a parallelism measurement, and for operating a control means for the drives, there are correspondingly provided measuring members operatively connected to said drives.

6. Apparatus according to claim 4, wherein the guide mechanism essentially comprises a guide part and a slide part, said slide part has on an end thereof a vacuum-pressurizable air bearing arranged orthogonally to the sliding plate and operatively connected to the support element and a vacuum-pressurizable air bearing arranged substantially parallel to the sliding plate and operatively connected to the sliding plate.

7. Apparatus according to claim 6, wherein the guide part has two parallel spaced webs arranged at right angles to the sliding plate and between which the slide part is displaceably guided in the Y direction by means of an air bearing constructed as a counterpressure bearing.

8. Apparatus according to claim 7, wherein said guide part is formed by webs and a flange interconnecting the webs and has a U-shaped cross-section and is provided on inside faces with the counterpressure bearing acting against two lateral faces of the slide part.

9. Apparatus according to claim 2, wherein the electromotive drives are constructed as electrical direct current drives.

10. Apparatus according to claim 2, wherein the electromotive drives are constructed as direct current pulse linear drives.

11. Apparatus for performing the in-feed of a working member to a working station, comprising a sliding plate; a support element for receiving the working member and arranged on the sliding plate; at least two electromotive drives operatively connected to said support element to adjust the support element in X and Y direction along two axes of coordinates oriented substantially at right angles to one another in a plane, with respect to the sliding plate, said support element being operatively connected with a moving part of a respective drive and being movable by said drives over a sliding bearing associated with the sliding plate in a single given horizontal plane with a translational degree of freedom, said support element being arranged in substantially freely floating manner on said sliding plate, wherein each of the electromotive drives has a stator body which has a E-shaped profile cross-section with spaced flanges provided on an inside with magnetic bodies, and a bobbin provided between the flanges in corresponding recesses and which is freely movable in a plane, and is operatively connected to the support member, and, upon corresponding direct current excitation thereof, is operated in such a way that the bobbin which embraces a central flange of the stator body constituting a pole is movable together with the support member in a first direction oriented in accordance with an axis of the bobbin and in a second direction substantially at right angles to said first direction.

12. Apparatus according to claim 2, wherein each of the electromotive drive includes a drive element moved, upon electric current excitation, and constructed with the support element as a one piece component, in which a magnetic flux direction of the moved drive element substantially passes through a center of gravity of the support element.

13. Apparatus for performing the in-feed of a working member to a working station, comprising a sliding plate; a support element for receiving the working member and arranged on the sliding plate; at least two drives operatively connected to said support element to adjust the support element in X and Y direction along two axes of coordinates oriented substantially at right angles to one another in a plane, with respect to the sliding plate, said support element being operatively connected with a moving part of a respective drive and being movable by said drives over a sliding bearing associated with the sliding plate in a single given horizontal plane with a translational degree of freedom, said support element being arranged in substantially freely floating manner on said sliding plate, wherein a) each drive comprises a fixed stator body arranged on a base plate and having two horizontal spaced apart slots, a bobbin, and a support member arranged on the support element and said slots serving to receive said bobbin operatively connected to the stator body, and b) the bobbin with the support member, when said bobbin is excited by direct current, are movable relative to the stator body in a first direction (X) and at right angles thereto in a second direction (Y).

14. Apparatus according to claim 13, wherein said support element with the support member and the bobbin is constructed as a rigid one piece component.

15. Apparatus according to claim 4, wherein the optronic measuring means comprises:

a) at least one measuring element having bar units oriented in the X and at least one measuring element having bar units oriented in the Y direction and operatively connected to the support element, each measuring element having an associate measuring head, b) at least two optronic measuring heads provided on a side facing the measuring elements and arranged in fixed manner on the sliding plate with respect to a respective measuring element, and c) each measuring head brings about a position-dependent operation of the control means for said drives with respect to said support element.

16. Apparatus according to claim 15, wherein each measuring element is plate-like and is arranged in a recess of the support element facing a surface of the sliding plate and each measuring head is arranged in a recess of the sliding plate facing said support element.

17. Apparatus according to claim 4, wherein said guide mechanism comprises a T-shaped slide part having a flange and a web and being linearly guided on a guide part fixed to the sliding plate and which with the flange thereof is operatively connected by a vacuum-pressurizable air bearing to the support element, and with the web thereof is operatively connected by a vacuum-pressurizable air bearing to the sliding plate and the guide part.

18. Apparatus according to claim 4, wherein said guide mechanism comprises a substantially T-shaped slide part mounted between two spaced guide parts arranged on the sliding plate and which includes a flange and a web, said support element being operatively connected with the flange by a vacuum-pressurizable air bearing between the support element and the flange, and the web being arranged in a horizontal plane in spaced manner from the sliding plate between said two guide parts by means of two profiled coupling elements arranged in corresponding recesses formed in said web and said guide parts, and wherein said web has recesses in which in each case is provided a counter-pressure air bearing acting on a corresponding coupling element.

19. Apparatus according to claim 1, wherein each drive is an electromotive drive having a fixed stator body and a bobbin and a support member and wherein the support element together with the bobbin and the support member is movable relative to the fixed stator body in a first direction in substantially the same direction as a bobbin axis and in a second direction at right angles to said bobbin axis.

* * * * *